Figure 1:
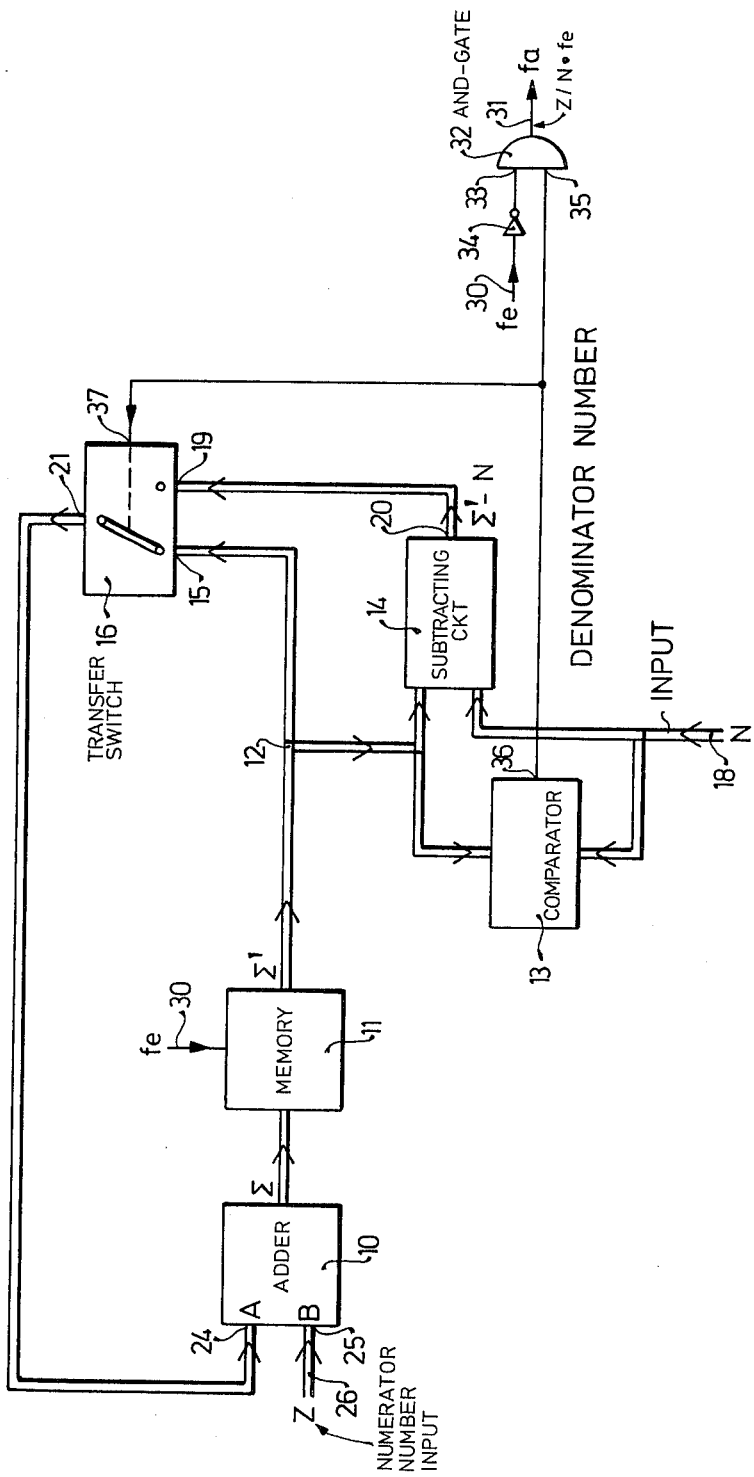

United States Patent [19]

Borst

[11] 4,078,203
[45] Mar. 7, 1978

[54] CONTROLLED FREQUENCY DIVISION FREQUENCY DIVIDER CIRCUIT

[75] Inventor: Wolfgang Borst, Schwieberdingen, Germany

[73] Assignee: Robert Bosch GmbH, Stuttgart, Germany

[21] Appl. No.: 721,952

[22] Filed: Sep. 10, 1976

[30] Foreign Application Priority Data

Sep. 18, 1975 Germany .............................. 2541595

[51] Int. Cl.² ...................... H03K 21/00; H03K 23/06
[52] U.S. Cl. ................................ 328/39; 235/92 DM; 328/46; 364/703
[58] Field of Search ....................... 328/39, 41, 46, 48; 307/225 R; 235/92 DM, 150.3

[56] References Cited

U.S. PATENT DOCUMENTS

| 3,614,631 | 10/1971 | BeVier et al. | 328/48 |
| 3,716,794 | 2/1973 | Teggatz et al. | 328/39 |

Primary Examiner—Stanley D. Miller, Jr.
Attorney, Agent, or Firm—Flynn & Frishauf

[57] ABSTRACT

To control the division ratio of an input frequency applied to a loop circuit including an adder, the overflow output of which is fed back to one of its inputs, the division denominator is applied to a comparator to be compared with the overflow output of the adder to select, in accordance with the comparison in the comparator, with respect to a selected denominator number, the frequency division, so that the output of the adder will be representative of a converted frequency as selected with respect to the denominator number.

5 Claims, 2 Drawing Figures

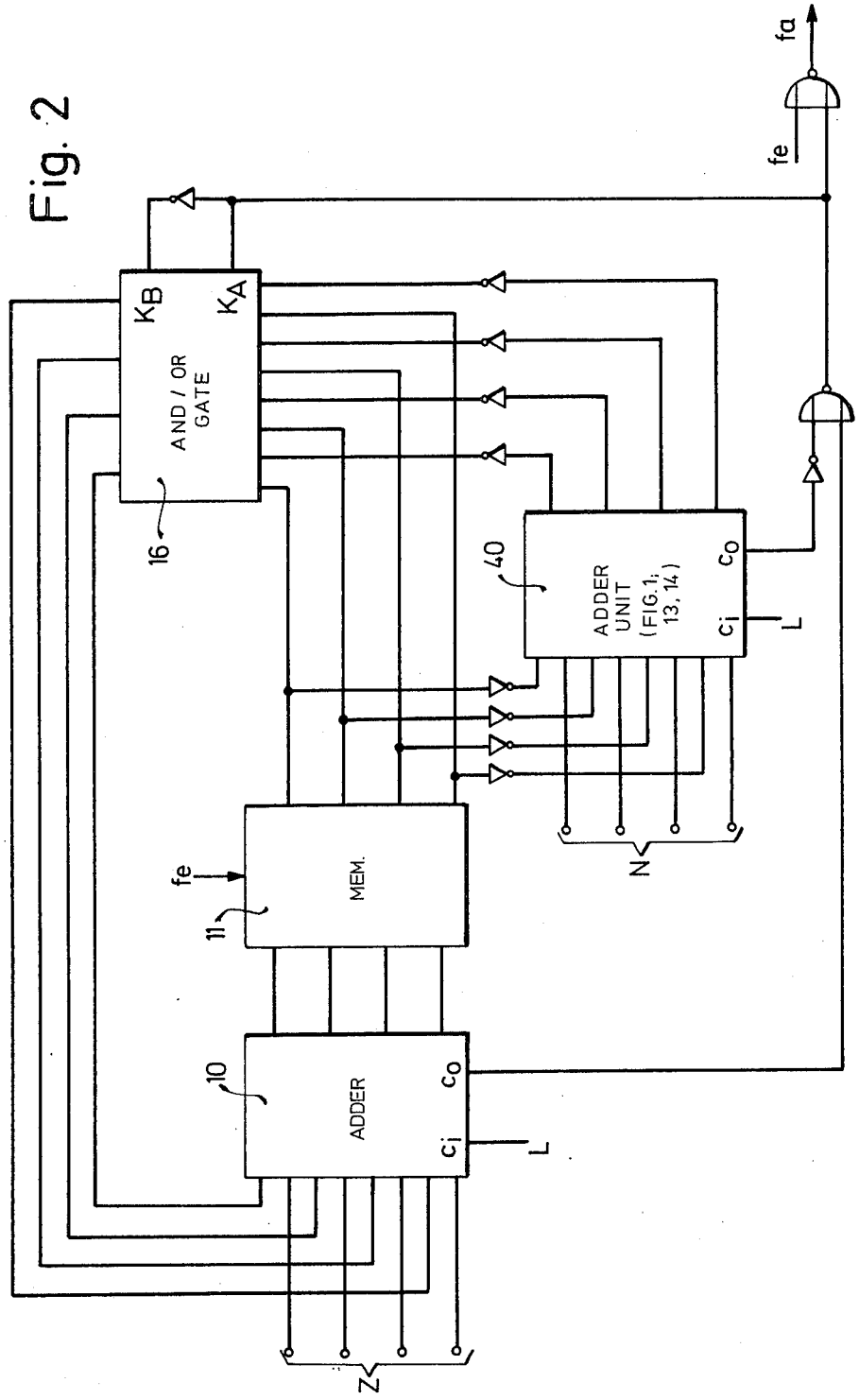

CONTROLLED FREQUENCY DIVISION FREQUENCY DIVIDER CIRCUIT

The present invention relates to an electronic circuit arrangement for frequency division, and more particularly to such a circuit in which the frequency division can be controlled.

It has previously been proposed to provide a frequency divider network by using an adder with a feedback circuit. At each clock cycle, a number Z is added to the sum entered into the adder. When the number Z in the added is exceeded, the maximum will be entered as the sum in the adder and an output signal indicative of an overflow will appear at the overflow output terminal of the adder. If this overflow output is coupled with the clock rate, then a divided frequency will be obtained.

Circuits of this type do not provide for control of the overflow; thus, the division ratio is limited. In an actual construction, the adder has its output value together with a conversion factor, as represented by a number, applied to respective A and B inputs of the adder. The recurrence of the overflow signal, logically coordinated with the input frequency, corresponds to the divided frequency.

Frequency dividers of the type of the present invention are used, for example, in automotive vehicles to obtain divided output signals from transducers. It has been proposed to use the teeth of the starter gear to influence the magnetic path of an inductive transducer to provide a speed or rotation output signal. If, for example, the signal should be applied to a certain type of ignition timing system which should be invarying, regardless of the type of engine or the number of teeth on its starter gear, it is necessary to match the angle, corresponding to a certain number of gears, to a predetermined standard value. Thus, a divider circuit has to be provided which divides, differently, for different engine types having different numbers of teeth on the starter gear in order to be able to use the same ignition timing circuit. Thus, frequency division by different divider denominators may be necessary. To permit coordinating the angular resolution of different starter wheels with respect to a standard, it is necessary to find a common denominator for the frequency division; the frequency divider, applied to resolve the output signals from different transducers used with different types of engines, thus must have a selectable dividing factor.

Frequency dividers are also used in phase-locked loop (PLL) circuits; the feedback circuits thereof usually require frequency dividers.

It is an object of the present invention to provide a frequency divider system and circuit in which the division ratio, that is, the denominator of the divider, can be selected.

SUBJECT MATTER OF THE PRESENT INVENTION

Briefly, the system uses basically the well-known adder-and-overflow frequency divider; in accordance with the invention, a comparator is provided which permits selection of feedback of overflow signals. The comparator, therefore, permits selection of a selectable value upon the occurrence of which overflow should occur.

The division ratio should be adjustable as a fraction Z/N (Z SN), in which Z is represented as a binary number applied to the B-input of the adder; the comparator compares the value of the adder with a value N; the A input of the adder, that is, its feedback input is energized in dependence on the output from the comparator.

A subtracting stage is preferably provided in which the difference between the content of the adder and the N value is formed and, depending on the output signal of the comparator, the content of the adder or the difference signals are fed back to the A input of the adder. The adder, therefore, will have the value of the adder itself, or the difference between the value of the adder and the comparison number applied to its feedback terminal. The comparator output signal will be the converted frequency when it is logically coupled to the input signal.

The invention will be described by way of example with reference to the accompanying drawings, wherein:

FIG. 1 is a general block circuit diagram of the controllable frequency divider, illustrating the various functions of separate functional components; and FIG. 2 is a more specific block diagram of the frequency divider, constructed, for example, by interconnected groups of integrated circuits, which may combine functions separately illustrated, in separate blocks in FIG. 1, in a single integrated circuit element.

An adder 10 (FIG. 1) has its output $\Sigma$ connected to a memory 11. The output of memory 11 is connected to a junction 12. Junction 12 is connected to a comparator 13, a subtracting circuit 14 and to the input terminal 15 of a transfer switch 16. The second comparison input to the comparator 13, as well as a second input to subtracting circuit 14, are connected to a line 18, forming a denominator number input, to which a value N is applied. Switch input terminal 19 is connected to the output 20 of subtracting circuit 14. The transfer output 21 of the transfer switch 16 is connected to the A or transfer input 24 of the adder 10. The B, or numerator input 25 of the adder 10 is connected to a line 26 to which numerator the value Z of the dinision ratio Z/N is applied.

The connections sofar described between the functional blocks are indicated as double lines to symbolize data lines on which data words can be placed to transmit numerical values in binary coded form. Single control wires are shown as single lines. An input line 30 applies an input frequency $f_e$ to the memory 11; the output is derived at line 31. An AND-gate 32 is connected through an inverter 34 to the input line 30 with frequency $f_e$. A second input 35 to the AND-gate 32 is connected to the output 36 of comparator 13 and to the input 37 of the transfer switch 16, forming the control terminal therefor. The output from AND-gate 32, at line 31, is the divided frequency $f_a$.

Operation: In the switch position of transfer switch 16 shown in FIG. 1, and starting with an initial number (which may be 0) in adder 10, number Z is added in adder 10 with each $f_e$ pulse, and the added value is stored in memory 11. The output of memory 11, $\Sigma$, is compared in comparator 13 with the value N. The output 36 of the comparator 13 will have a signal applied thereon which depends on the comparison of the value N with the number stored in memory 11. Depending on the value in memory 11, with respect to the value of N, the output signal at terminal 36 of comparator 13 will either control transfer switch 16 to change over, or not. At the same time, the difference between the stored number in memory 11 and N is formed in subtracting stage 14 and applied to terminal 19 of switch 16. If the value in memory 11 equals or exceeds that of N, the output signal at terminal 36 of comparator 13 will cause the transfer switch 16 to connect the transfer terminal 31 thereof with the input terminal 19. The adder 10 will have a new initial value. In this manner, the new initial value in adder 10 will be the difference between the value stored in memory 11 and the value N. Logically connected with the input signal $f_e$ at line 30 through inverter 34 and AND-gate 32, the output signal $f_a$ on line 31 will have the frequency divided signal appear thereat.

FIG. 2 illustrates a circuit as it can be actually constructed using commercially available integrated circuit elements. The adder 10 can be of the type CD 4008; memory 11 can be any standard memory; transfer switch 16 can be an AND/OR-gate of the type CD 4019. The comparison of the stored value in the memory 11 with the number N is carried out in an adder unit 40 connected to form, simulatneously, a comparating stage and a subtracting stage. The adder 40 can be similar to adder 10; a separate comparator, as shown in FIG. 1 for purposes of illustration of the operation, is then not needed since the subtraction can be related to a certain value to provide an output signal at that time.

The use of integrated circuits to construct the circuit elements with the function as shown and described in FIG. 1 thus shows that the entire unit can be integrated overall and built up as a single integrated circuit. A single component would then be provided in which the numerator as well as the denominator of the dividing circuit can be independently and separately controlled, connected as shown at N and Z in FIG. 2.

Various changes and modifications may be made within the scope of the inventive concept.

The invention will best be described in connection with an actual numerical example.

The object of the invention is to divide the input frequency $f_e$ on line 30 (FIG. 1) so that the output of AND-gate 32 will have the divided frequency $f_a$ appear thereat. The division ratio is given by the fraction Z/N. The numerator Z and the denominator N are quantities which are applied in binary form to the divider. Z is entered at line 26, N at line 18. As a limiting condition, Z must be less than or equal to N.

Let it be assumed that, at the beginning of the operation, the transfer input A of the adder 10 is zero; the input 25, that is, the B input of the adder 10 has a number Z in binary form. At the first pulse at the input frequency $f_e$, which is applied to input 30 at memory 11, the count state of the adder, in this case the number Z, is transferred into the memory. The output of the memory 11 now will have the value Z appear thereat. Comparator 13 compares the output in memory 11 with the numerator number N. At the same time, subtracting circuit 14 will form the difference between the count state of the memory 11 and the numerator N. If Z is less than N, no output will be derived from comparator 13 at terminal 36. The content in the memory 11 thus is transferred through transfer switch 16 in the position shown in FIG. 1 back to the A, 24 input of adder 10.

The adder 10 now will have at the input A the value Z; at the input B the value will likewise be Z. At the next pulse at the input frequency $f_e$, the sum 2Z will be transferred into memory 11. Comparator 13 will now make a new comparison with the denominator N, and subtracting circuit 14 will form a new difference between the content of memory 11, namely 2Z and the denominator N. This cycle will repeat until the output of the memory will have nZ applied thereto whereby nZ is a number which is at least equal to N (nZ ≧ N). The output 36 of comparator 13 will now provide a pulse which: (1) is connected to the input 37 of transfer switch 16 to cause connection between inputs 19 and 21 of the transfer switch and (2) provide a 1-signal at the input 35 of the AND-gate 32 so that, at the subsequent pulse at input frequency $f_e$, the input 33 of the AND-gate will be enabled to provide an output signal at terminal 31 of the AND-gate 32. If $nZ = N$, the output of the subtractor 14 will have the value 0. Due to transfer of the transfer switch 16, commanded by the signal at the input 37, the O-value will also be applied to the input 24, that is, the A input of the adder 10. The previously described cycle will repeat. As an example, let it be assumed that division is by 10. The numerator Z then will be 1 (Z = 1) and the denominator will be 10 (N = 10) After the tenth pulse ($n = 10$), comparator 36 will enable the AND-gate 32 to pass the tenth pulse from line 30 to the output line 31.

The comparator will also provide a pulse when nZ is greater than N. The output 31 will then likewise provide a pulse, and transfer switch 16 will connect the input 19 with the output 21 as before. The subtractor 14 will, however, prevent a number which differs from zero, namely $nZ - N$. This number is now applied to the A input 24 of the adder 10. Let the number ($nZ - N$) = T. At the subsequent pulse $f_e$ to the memory 11, memory 11 will have the number $T + Z$ stored therein, which number $T + Z$ is compared in comparator 13 and subtracted in subtractor 14 from the number N. The transfer switch will change over and connect input 15 to the output 21 if the number $T + Z$ is less than N. This cycle will repeat, as before, until $T + nZ$ is greater than or equal to N. Again, a pulse will then be provided from comparator 36 and applied to the transfer switch 16 as well as to the AND-gate 32.

Assume a dividing ratio 3/7, that is, Z = 3, N = 7. Upon $n = 3$, the first pulse is provided, whereas the subtractor will provide number 2 (T) to the A input 24 of the adder 10. At the next $f_e$ pulse, the memory 11 will have the sum of the inputs A and B stored therein. The A, 24 input of adder 10 has 2; the Z number 3, in the example, is connected to the B input and $2 + 3 = 5$ will be at the output of adder 10. At $n = 2$, output 31 of the AND-gate 32 will provide the next pulse since then $T = nZ = 8$, and the condition T = nZ is greater than N (= 7) has been met. The output 20 of the subtractor 14 will now have the number $T = 1$, which is applied to the A input 24 of the adder 10, and the cycle will repeat.

The value $n$ of the number of pulses at the $f_e$ 30 input has been counted anew after each $f_a$ output pulse.

I claim:

1. Controlled frequency converter circuit to provide controlled division of the frequency of an input signal ($f_e$) by a fraction (Z/N) having an adder-memory (10, 11);
means (30) applying input pulses ($f_e$) representing said input signal to be divided to one input of said adder-memory (10, 11);
means (25, 26) applying signals in binary pulse form representing the numerator (Z) of the frequency division ratio to a numerator input (B) of said adder-memory (10, 11);
means (24) applying a transfer number to a transfer input (A) of said adder-memory;

said adder-memory (10, 11) adding, upon each pulse of the input signal ($f_e$) the number appearing at the transfer input (A) to the numerator number (Z) applied to the numerator input (B) of the adder-memory (10, 11), and providing at its output (12) a sum signal ($\Sigma\pi$) upon occurrence of each pulse of the input signal ($f_e$);

and logic means (13, 14, 16) controlling transfer of the output from the adder-memory (10, 11) to said transfer input (A) as determined by said logic means, wherein the logic means includes a comparator (13) having a control input;

means (18) applying signals in binary pulse form representing the denominator (N) to said control input of the comparator and forming one comparison input thereof, the other comparison input of said comparator being connected to the output (12) of the adder-memory (10, 11);

and controlled switch means (16) connecting the output (12) of the adder-memory (10, 11) and the transfer input (A) thereof, said comparator (13) controlling said controlled switch means (16) to control transfer of the output from the adder-memory (10, 11) fed back to said transfer input (A) and providing an output when the comparison effected in said comparator (13) between the denominator signal (N) applied to the control input and the output sum ($\Sigma\pi$) from the adder-memory (10, 11) applied thereto has a predetermined relationship.

2. Circuit according to claim 1 wherein the comparator (13) provides, in accordance with the comparison of the output sum signal ($\Sigma\pi$) of the adder-memory (10, 11) and the denominator number (N) a control output having the characteristics when the denominator number (N) is less than the output number ($\Sigma\pi$) appearing at the output of the adder-memory (10, 11) an output will be provided at a comparison terminal (36) of the comparator (13);

and output logic means (32) are provided, combining the comparison output derived from the comparator (13) with the input signal ($f_e$) to provide a divided output signal ($f_a$), whereby the output (36) of the comparator (13), as logically combined with the input signal ($f_e$), will be representative of the converted frequency, as selected, with respect to the fraction defined by said denominator (N) and numerator (Z) numbers, and the division ratio is formed as a fraction (Z/N) of the numerator number (Z) applied to the numerator input (B) of the adder, the denominator number (N) being applied to the comparator (13).

3. Circuit according to claim 1, wherein said comparator (13) is connected to compare the contents ($\Sigma\pi$) of the adder — memory (10, 11) at each pulse ($f_e$) of the input signal with the value of the signal representative of the denominator number (N), and feedback of a new number to the transfer input (A) of the adder-memory (10, 11) is controlled in dependence on the result of the comparison in the comparator (13).

4. Circuit according to claim 1, wherein the logic means further comprises a subtracting stage (14) having applied thereto the output ($\Sigma\pi$) of the adder-memory (10, 11) and a signal representative of the denominator number (N) to form a difference signal; and wherein the controlled switch means (16) in the path of feedback from the adder-memory (10, 11) to the one transfer input (A) thereof comprises a transfer switch connectable further in the path from the output (20; $\Sigma\pi$-N) of the subtracting stage (14) and said transfer input (A), and connected to transfer, in dependence (1) if the comparison as effected in the comparator (13) is less than unity, the output signal from the adder-memory (10, 11) back to the said transfer input (A) thereof for further addition of the numerator (Z) upon the next pulse of the input signal ($f_e$) or (2) if the comparison as effected in the comparator (13) is unity or greater, the difference between the output signal ($\Sigma\pi$) from the adder-memory (10, 11) and said denominator signal (N), and forming the subtraction output ($\Sigma\pi$-N) of the subtracting circuit (14) to said transfer input (A) of the adder-memory (10, 11).

5. Converter circuit according to claim 4, wherein said comparator (13) and said subtracting stage (14) form a single combined integrated adder unit connected as a subtracting circuit with a separate output terminal ($C_O$) when the subtraction has a result representing a predetermined number, said output terminal ($C_O$) being connected to said logic means.

* * * * *